United States Patent
Sartler et al.

(10) Patent No.: US 9,389,263 B2
(45) Date of Patent: Jul. 12, 2016

(54) FILTER CAPACITOR DEGRADATION IDENTIFICATION USING MEASURED AND EXPECTED VOLTAGE

(71) Applicants: Christian Sartler, Milwaukee, WI (US); Yogesh Patel, Grafton, WI (US); Lixiang Wei, Mequon, WI (US); Mark G. Phillips, Brookfield, WI (US)

(72) Inventors: Christian Sartler, Milwaukee, WI (US); Yogesh Patel, Grafton, WI (US); Lixiang Wei, Mequon, WI (US); Mark G. Phillips, Brookfield, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 226 days.

(21) Appl. No.: 14/296,836

(22) Filed: Jun. 5, 2014

(65) Prior Publication Data

US 2015/0355259 A1    Dec. 10, 2015

(51) Int. Cl.
| | |
|---|---|
| *G01R 31/12* | (2006.01) |
| *G01R 31/14* | (2006.01) |
| *G01R 31/02* | (2006.01) |
| *G01R 19/00* | (2006.01) |
| *G01R 31/34* | (2006.01) |
| *G01R 27/26* | (2006.01) |
| *H02M 1/12* | (2006.01) |

(52) U.S. Cl.
CPC .......... *G01R 31/028* (2013.01); *G01R 19/0084* (2013.01); *G01R 27/2688* (2013.01); *G01R 31/34* (2013.01); *H02M 1/126* (2013.01); *G01R 19/0092* (2013.01); *G01R 31/02* (2013.01)

(58) Field of Classification Search
CPC .... G01R 31/016; G01R 31/02; G01R 31/028; G01R 31/34; G01R 27/2688; G01R 19/0084; G01R 19/0092; H02M 1/126
USPC ......... 324/500, 522, 537, 548, 555, 658, 686, 324/713; 702/47, 52, 64, 65, 117, 118
See application file for complete search history.

(56) References Cited

U.S. PATENT DOCUMENTS

| | | | | |
|---|---|---|---|---|
| 4,419,621 A | * | 12/1983 | Becker .................. | H02H 3/365 324/548 |
| 4,721,916 A | * | 1/1988 | Hanasawa .......... | G01R 31/1272 324/520 |
| 5,319,513 A | | 6/1994 | Lowenstein et al. | |
| 5,491,725 A | | 2/1996 | White | |
| 5,796,258 A | | 8/1998 | Yang | |
| 5,804,973 A | | 9/1998 | Sinohara | |

(Continued)

FOREIGN PATENT DOCUMENTS

| | | |
|---|---|---|
| CN | 201393056 Y | 1/2010 |
| EP | 2299568 A1 | 3/2011 |

(Continued)

OTHER PUBLICATIONS

Bhattacharya, "Basic Electrical and Electronics Engineering", Aug. 18, 2011, 10 pgs.

(Continued)

*Primary Examiner* — Hoai-An D Nguyen
(74) *Attorney, Agent, or Firm* — Fay Sharpe LLP

(57) ABSTRACT

Methods and apparatus are presented for detecting degrading filter capacitors in motor drives or other power converters, in which an expected DC equivalent voltage and a measured DC equivalent voltage are computed according to sampled filter circuit currents and voltages, and compared to selectively identify filter capacitor degradation conditions in a power converter filter circuit.

21 Claims, 5 Drawing Sheets

(56) References Cited

U.S. PATENT DOCUMENTS

| | | | |
|---|---|---|---|
| 6,166,929 | A | 12/2000 | Ma et al. |
| 6,269,010 | B1 | 7/2001 | Ma et al. |
| 6,366,483 | B1 | 4/2002 | Ma et al. |
| 6,525,951 | B1 | 2/2003 | Paice |
| 6,642,689 | B2 | 11/2003 | Ishida et al. |
| 6,667,866 | B1 | 12/2003 | LaPlace |
| 7,274,576 | B1 | 9/2007 | Zargari et al. |
| 7,309,973 | B2 | 12/2007 | Garza |
| 7,495,410 | B2 | 2/2009 | Zargari et al. |
| 7,495,938 | B2 | 2/2009 | Wu et al. |
| 7,511,976 | B2 | 3/2009 | Zargari et al. |
| 7,616,005 | B2 | 11/2009 | Kalyuzhny et al. |
| 7,683,568 | B2 | 3/2010 | Pande et al. |
| 7,764,523 | B2 | 7/2010 | Conticelli et al. |
| 7,782,009 | B2 | 8/2010 | Wiseman |
| 7,786,735 | B2 | 8/2010 | Kalyuzhny et al. |
| 7,800,348 | B2 | 9/2010 | Zargari |
| 7,812,615 | B2 | 10/2010 | Gajic et al. |
| 7,818,137 | B2 * | 10/2010 | Agarwal ............ G01R 31/2884 702/117 |
| 7,990,097 | B2 | 8/2011 | Cheng et al. |
| 8,009,450 | B2 | 8/2011 | Royak et al. |
| 8,030,791 | B2 | 10/2011 | Lang et al. |
| 8,044,631 | B2 | 10/2011 | Dai et al. |
| 8,183,874 | B2 | 5/2012 | Dommaschk |
| 8,259,426 | B2 | 9/2012 | Xiao et al. |
| 8,259,480 | B2 | 9/2012 | Hasler |
| 8,350,397 | B2 | 1/2013 | Lang et al. |
| 8,352,203 | B2 | 1/2013 | Seibel et al. |
| 8,395,910 | B2 | 3/2013 | Alexander |
| 8,400,800 | B2 | 3/2013 | Alexander |
| 8,587,160 | B2 | 11/2013 | Dai et al. |
| 8,643,383 | B2 | 2/2014 | Xiao et al. |
| 8,729,844 | B2 | 5/2014 | Feng et al. |
| 8,937,796 | B2 | 1/2015 | Xiao et al. |
| 9,054,589 | B2 | 6/2015 | Cheng et al. |
| 2001/0017489 | A1 | 8/2001 | Inoue et al. |
| 2004/0257093 | A1 | 12/2004 | Sakiyama |
| 2009/0072982 | A1 | 3/2009 | Cheng et al. |
| 2010/0161259 | A1 | 6/2010 | Kim et al. |
| 2012/0153965 | A1 * | 6/2012 | Huang ................ G01R 31/028 324/548 |
| 2012/0176141 | A1 * | 7/2012 | Mikami ................ G01D 21/02 324/500 |
| 2012/0271572 | A1 | 10/2012 | Xiao |
| 2013/0057297 | A1 | 3/2013 | Cheng |
| 2013/0076151 | A1 | 3/2013 | Bae et al. |
| 2013/0120038 | A1 | 5/2013 | Kerkman et al. |
| 2013/0120039 | A1 | 5/2013 | Kerkman et al. |
| 2013/0279214 | A1 | 10/2013 | Takase et al. |
| 2013/0286692 | A1 | 10/2013 | Patel et al. |
| 2014/0012552 | A1 | 1/2014 | Zik |
| 2014/0217980 | A1 | 8/2014 | Malrieu |
| 2014/0320056 | A1 | 10/2014 | Royak |
| 2015/0092460 | A1 | 4/2015 | Tallam |
| 2015/0153397 | A1 | 6/2015 | Kerkman et al. |
| 2015/0155794 | A1 | 6/2015 | Long |
| 2015/0241503 | A1 | 8/2015 | Bhandarkar |
| 2015/0263600 | A1 | 9/2015 | Bhandarkar et al. |

FOREIGN PATENT DOCUMENTS

| | | |
|---|---|---|
| EP | 2 390 997 A2 | 11/2011 |
| EP | 2660962 A2 | 11/2013 |
| FR | 2980053 | 3/2011 |
| WO | WO2012010353 A1 | 1/2012 |
| WO | WO2012044737 A1 | 4/2012 |
| WO | WO2012110087 A1 | 8/2012 |
| WO | WO2012110088 A1 | 8/2012 |
| WO | WO 2013/038098 | 3/2013 |

OTHER PUBLICATIONS

European Search Report completed Jul. 20, 2015 for Application No. EP 15 15 6270.
ABB Bay Control REC670 Application manual, Relion 670 series, http://www05./abb.com/global/scot/scot354.nsf, Oct. 10, 2011, pp. 1-586 (2 parts).
Transformer protection RET670 ANSI Application manual, Relion 670 series, http://www.abb.com/product/db0003db004281/c12573e700330419c/257f000263ad5.aspx#!, May 6, 2011.
"Protective Relays", iCP-630 Capacitor Bank Protection Relay, Cooper Power Systems, Jan. 2011, pp. 1-8.
ABB Distribution Automation Handbook, Section 8.10 Protection of Capacitor Banks, Mar. 5, 2011.
GE C70 Capacitor Bank Protection and Control System UR Series Instruction Manual C70 Revision: 6.0x, Copyright @ 2011, GE Multilin, http://www.GEmultilin.com, pp. 1-644 (2 parts).
"iCP-630 Capacitor Bank Protection Relay", Cooper Power Systems, Mar. 2007.
U.S. Appl. No. 13/570,781, "Filter Capacitor Degradation Detection Apparatus and Method", by Patel et al., filed Aug. 9, 2012.
U.S. Appl. No. 13/872,177, "Methods and Apparatus for Active Front End FilterCapacitor Degradation Detection", by Royak et al., filed Apr. 29, 2013.
U.S. Appl. No. 14/042,753, "Method and Apparatus for Detecting AFE Filter Capacitor Degradation", by Tallam et al., filed Oct. 1, 2013.
U.S. Appl. No. 14/095,169, "Impedance Detector Apparatus and Method", by Kerkman et al., filed Dec. 3, 2013.
U.S. Appl. No. 14/187,972, "Filter Capacitor Degradation Identification Using Computed Current", by Bhandarkar et al., filed Feb. 24, 2014.
U.S. Appl. No. 14/204,317, "Filter Capacitor Degradation Identification Using Computed Power", by Bhandarkar et al.
Rodriguez-Valdez, et al., "Phase Locked Loop for Unbalanced Utility Conditions", 2010 Applied Power Electronics Conference and Exposition (APEC), 2010 25th Annual IEEE 2010, Piscataway, NJ, Feb. 21, 2010, pp. 634-641.
U.S. Appl. No. 13/570,781, filed Aug. 9, 2012.
U.S. Appl. No. 13/872,177, filed Apr. 29, 2013.
U.S. Appl. No. 14/042,753, filed Oct. 1, 2013.
U.S. Appl. No. 14/095,169, filed Dec. 3, 2013.
U.S. Appl. No. 14/187,972, filed Feb. 24, 2014.
U.S. Appl. No. 14/204,317, filed Mar. 11, 2014.
Lee, et al., "Online capacitance estimation of DC-link electrolytic capacitors for three-phase AC/DC/AC PWM converters using recursive least squares method", IEE Proc.-Electr. Power Appl., vol. 152, No. 6, Nov. 2005.
European Search Report dated Apr. 20, 2016 for Application No. EP 15170476.4.

\* cited by examiner

US 9,389,263 B2

FILTER CAPACITOR DEGRADATION IDENTIFICATION USING MEASURED AND EXPECTED VOLTAGE

BACKGROUND INFORMATION

The subject matter disclosed herein relates to power conversion, and more specifically to apparatus and techniques for detection of degraded filter circuit capacitor components.

BRIEF DESCRIPTION

Various aspects of the present disclosure are now summarized to facilitate a basic understanding of the disclosure, wherein this summary is not an extensive overview of the disclosure, and is intended neither to identify certain elements of the disclosure, nor to delineate the scope thereof. Rather, the primary purpose of this summary is to present various concepts of the disclosure in a simplified form prior to the more detailed description that is presented hereinafter.

In one embodiment, a method is provided for detecting filter circuit capacitor degradation, including measuring filter circuit currents and voltages, computing an expected DC equivalent voltage value at least partially according to the measured currents and a filter capacitor impedance value, and computing a measured DC equivalent voltage value at least partially according to the filter circuit voltages. A voltage change value is computed representing deviation of measured and expected DC equivalent voltage values, and a filter capacitor degradation condition is selectively detected or identified at least partially according to the voltage change value.

In one embodiment, a power conversion system is disclosed, including a filter circuit, a measurement circuit configured to measure filter circuit branch currents and filter circuit voltages, and at least one processor programmed to compute an expected DC equivalent voltage value at least partially according to the filter circuit branch currents and a filter capacitor impedance value, and to compute a present measured DC equivalent voltage value at least partially according to the filter circuit voltages. The processor is further programmed to compute a voltage change value representing a voltage deviation of a measured DC equivalent voltage value and an expected DC equivalent voltage value, and to selectively identify a filter capacitor degradation condition in the filter circuit at least partially according to the voltage change value.

BRIEF DESCRIPTION OF THE DRAWINGS

The following description and drawings set forth certain illustrative implementations of the disclosure in detail, which are indicative of one or more exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
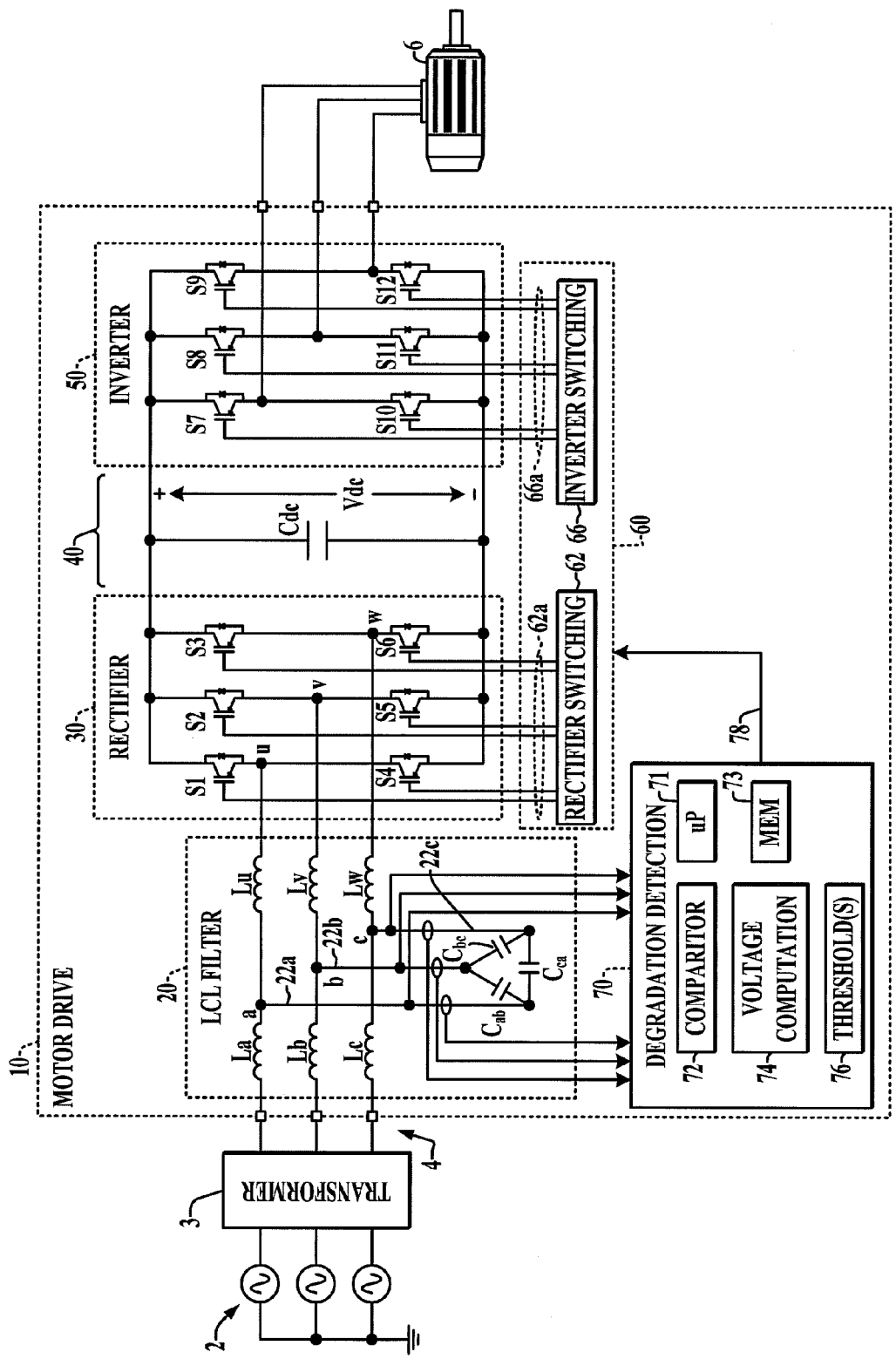
FIG. 1 is a schematic diagram illustrating an exemplary active front end (AFE) motor drive including an input LCL filter with delta-connected filter capacitors as well as filter capacitor degradation detection apparatus according to one embodiment.

Referring now to the figures, one or more embodiments or implementations are hereinafter described in conjunction with the drawings, wherein the various features are not necessarily drawn to scale. Motor drives and other power converters operate using power from AC power sources. An input filter circuit is often provided to reduce switching noise associated with operation of the power converter, and particularly to control total harmonic distortion (THD) generated by high frequency operation of certain active front end rectifiers. In particular, inductor-capacitor (L-C) or inductance-capacitance-inductance (L-C-L) input filter circuitry may be associated with each AC input phase to control the harmonic content of a connected power grid. The capacitors in such filter circuits, however, may be subject to damage or degradation, and such degradation may be costly in terms of replacement component costs, labor for inspection and replacement, as well as downtime for the power converter and any associated machinery to manually identify one or more degraded capacitors. Moreover, capacitor degradation may not be identifiable through simple visual inspection by service personnel. Fuses may be placed in line with the filter circuit capacitors, but the fuses may not open quickly enough to prevent capacitor degradation or may open frequently in normal operation with healthy capacitors, leading to excessive system downtime and further costs for inspection and system verification. In this regard, the filter capacitors may degrade to a high resistance short whereby fuses may not protect the motor drive or other power conversion system components, and the failure modes of the filter capacitors often go unobserved until significant degradation has occurred.

The present disclosure provides filter capacitor degradation identification solutions that find particular utility in connection with active front end power converters and other power converters, as well as in other filter circuit applications. Exemplary methods and apparatus are hereinafter disclosed for active front end power converter filter capacitor degradation detection in which filter circuit branch currents and voltages are measured, with expected and measured DC equivalent voltage values being computed and compared to selectively identify capacitor degradation conditions in the filter circuit. The disclosure thus presents a significant advance since fuses are not required and the onset of degradation can be assessed prior to system damage. The detected degradation condition can be used, in turn, to provide a system alert or warning and/or to shut down the power converter in certain non-limiting applications.

The disclosed concepts find utility in association with active front end motor drives as well as other forms of power converters. In addition, although illustrated in the context of three-phase input devices, the disclosed concepts can be employed in power converters having any number of input phases in which a filter includes a capacitor circuit or capacitor bank. The disclosed techniques and apparatus advantageously facilitate identification of potential degradation of individual filter capacitors or groups thereof, and a determination can be made as to whether one or more of these components are degrading in certain embodiments. The degradation detection, moreover, can be used to initiate any appropriate remedial or reporting action. In this manner, the present disclosure avoids the over inclusive or under inclusive nature of protective fuse-based solutions, and also advantageously facilitates early identification of the onset of component degradation filter capacitors. This, in turn, can facilitate reduction in system downtime and reduce or mitigate maintenance costs associated with operation of a motor drive or other power converter.

Figure 2:
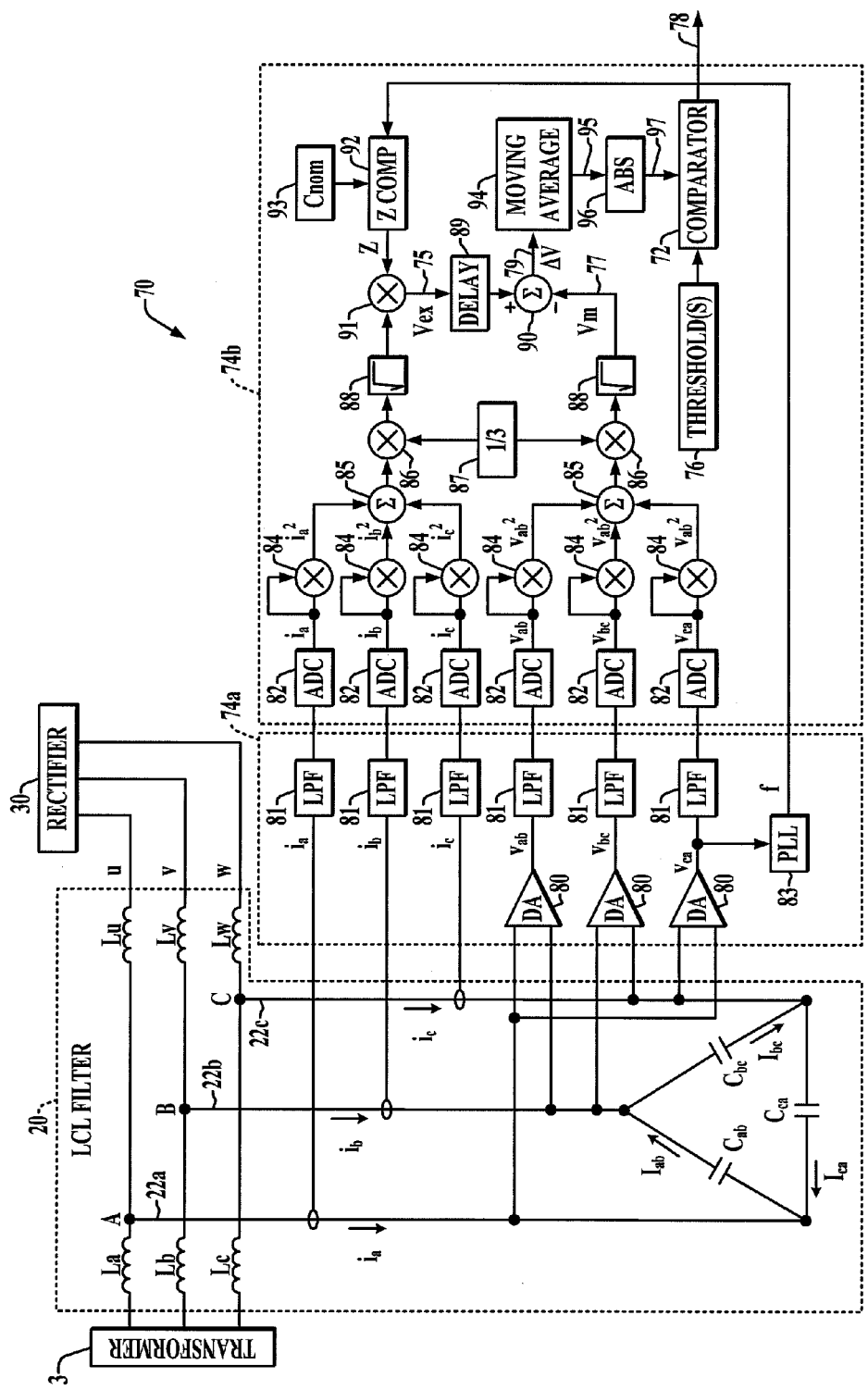
FIG. 2 is a partial schematic diagram illustrating further details of an exemplary degradation detection system in the motor drive of FIG. 1 according to one embodiment.

FIGS. 1 and 2 illustrate an exemplary active front end motor drive 10 with a delta-connected filter circuit 20, where FIG. 2 shows details of an exemplary filter capacitor degradation detection system 70 according to one embodiment. The illustrated drive 10 is a voltage source converter (VSC) having an intermediate DC link circuit 40 with one or more bus capacitors (Cdc). However, the various concepts of the present disclosure are not limited to VSC implementations, and other embodiments are possible in current source converter (CSC) drives having one or more DC link chokes or inductors, cascaded multilevel drives, etc., wherein the present disclosure is not limited to the illustrated examples. The motor drive 10 includes a three phase AC input 4 receiving input power from a three-phase source 2 via an optional transformer 3. As best seen in FIG. 1, the drive 10 includes a rectifier 30, an intermediate DC link circuit 40 and an output inverter 50 providing variable frequency, variable amplitude AC output power to drive a motor load 6. Although illustrated and described in the context of a motor drive type power converter 10, the various disclosed concepts can be employed in other forms of power converters, whether providing an AC output or a DC output to drive a motor or other type of load 6. The drive input 4 in the illustrated non-limiting example has three input phase terminals which are connected through an LCL input filter circuit 20 to the AC input of the switching (e.g., active front end) rectifier 30. Although the filter circuit 20 in FIGS. 1 and 2 is an "L-C-L" filter having two inductors in each series circuit path between the input 4 and the rectifier 30, the various concepts of the present disclosure can be employed in connection with other filter circuit topologies including without limitation L-C filters, C-L filters, etc.

Figure 3:
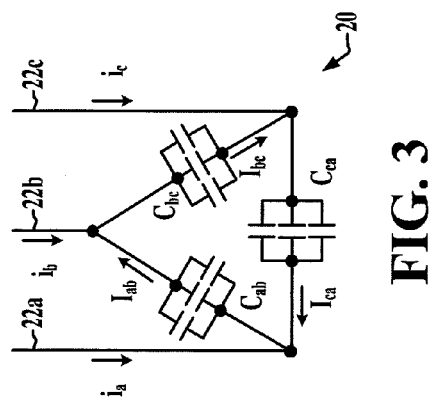
FIG. 3 is a partial schematic diagram illustrating a filter capacitor bank embodiment with multiple capacitors in each line-line branch of the delta-connected filter.

In the illustrated example of FIGS. 1 and 2, the filter circuit 20 includes a set or bank of three capacitors $C_{ab}$, $C_{bc}$ and $C_{ca}$ connected in a delta configuration. Other implementations are possible, for example, in which the capacitor bank of the filter circuit 20 is configured in a "Y" configuration (e.g., capacitors $C_a$, $C_b$ and $C_c$ in FIG. 6 below). Moreover, the individual capacitors of the filter circuit 20 can be constructed using a single capacitor component, or may be individually constructed as series and/or parallel combinations of multiple capacitive components in various embodiments, and are hereinafter collectively termed "filter capacitors". For example, FIG. 3 illustrates a delta-connected filter capacitor bank embodiment with three parallel-connected capacitor components in each line-line branch forming the filter capacitors $C_{ab}$, $C_{bc}$ and $C_{ca}$ of the delta-connected filter 20. In addition, certain embodiments of the filter circuit 20 may also include discharge resistors (not shown) individually connected in parallel across a corresponding one of the filter capacitors $C_{ab}$, $C_{bc}$ and $C_{ca}$ (in either or both of the delta or Y configurations) providing discharge paths with respect to filter capacitor voltages. Furthermore, damping resistors (not shown) can be provided in certain filter circuit embodiments, in series with the filter capacitors. Moreover, while the various concepts of the present disclosure are illustrated and described in connection with input LCL or LC filters 20, the capacitor degradation detection and identification methods and apparatus of the present disclosure can separately or in combination be employed for detecting degradation of trap filter or output filter capacitor components, such as in an LC or LCL filter circuit (not shown) connected between the inverter AC outputs and a driven load 6, including one or more inductors connected in series between the inverter 50 and the load 6 and a bank of capacitors individually connected to at least one of the AC lines, whether in a delta configuration or in a Y configuration.

As seen in FIG. 1, the switching rectifier 30 includes switching devices S1-S6 individually coupled between a corresponding one of the AC input phases (u, v, w) and a corresponding DC bus terminal (+ or −) of the DC link circuit 40. A drive controller 60 includes a rectifier switching controller 62 that provides rectifier switching control signal 62a to the rectifier switches S1-S6 to cause the rectifier 30 to convert received three-phase AC input power to provide a DC voltage Vdc across a DC bus capacitance Cdc of the link circuit 40 using any suitable pulse width modulation (PWM) technique. Other embodiments are possible, for example, using passive rectifier circuitry 30. The drive inverter 50 receives DC input power from the link circuit 40 and includes inverter switches S7-S12 individually coupled between one of the positive or negative DC bus terminals and a corresponding output phase connected to the motor load 6. The inverter switches S7-S12 are operated according to inverter switching control signals 66a provided by an inverter switching component 66 of the drive controller 60, which generates the signals 66a according to any suitable pulse width modulation technique to convert DC power from the link circuit 40 to provide variable frequency, variable amplitude AC output power to the motor load 6.

The switching rectifier 30 and the inverter 50 may employ any suitable form of switching devices S1-S12 including without limitation insulated gate bipolar transistors (IGBTs), silicon controlled rectifiers (SCRs), gate turn-off thyristors (GTOs), integrated gate commutated thyristors (IGCTs), etc. The controller 60 can be any suitable hardware, processor-executed software, processor-executed firmware, programmable logic, analog circuitry, etc. or combinations thereof which provides control signals 62a, 66a for operating the rectifier 30 and the inverter 50, and may implement other functionality associated with operation of the motor drive 10. While the illustrated embodiment includes a switching inverter 50 and associated controller 66, other power converter configurations or embodiments are possible in which the DC power provided at the bus circuit 40 is provided as an output, wherein the inverter 50 and inverter switching controller 66 may be omitted.

The LCL filter circuit 20 in FIGS. 1 and 2 includes three series circuits individually connected between the power converter input 4 and the corresponding phase of the rectifier AC input. Each series circuit includes a pair of series-connected filter inductors, with the first circuit including inductor La connected between the first power converter input terminal and a first intermediate node "a", as well as a second filter inductor Lu connected between the intermediate node a and a first rectifier AC input node "u". Similarly, the second series circuit includes a first inductor Lb connected between the second motor drive input and a second intermediate node "b"

and a second inductor Lv connected between the node b and the second rectifier input "v", as well as a third series circuit with first and second inductors Lc and Lw joined by a third intermediate node "c". In addition, the filter circuit 20 includes three capacitor circuit branches 22a, 22b and 22c respectively connecting the nodes a, b and c to a delta configuration of the three filter capacitors $C_{ab}$, $C_{bc}$ and $C_{ca}$. In the illustrated delta-connected capacitor circuit or capacitor bank, each filter capacitor is connected to two of the capacitor circuit branches 22 (e.g., line-to-line) as shown. Other non-limiting embodiments are possible in which a CL filter circuit 20 is provided (not shown) for interfacing the motor drive 10 with the power source 2, directly or through a transformer 3, for instance, with the first filter inductors La, Lb and Lc omitted due to the inductance of the secondary windings of the transformer 3, and with the input terminals 4 and the capacitor circuit branches 22a, 22b and 22c being connected directly to the inductors Lu, Lv and Lw at the nodes a, b and c, respectively.

As seen in FIGS. 1 and 2, moreover, a degradation detection system 70 is operatively coupled with the filter circuit 20, including measurement circuitry 74a (FIG. 2) to sense or otherwise measure line-to-line voltages $V_{ab}$, $V_{bc}$ and $V_{ca}$ across the filter capacitors $C_{ab}$, $C_{bc}$ and $C_{ca}$, for example, by sensing the voltages at the branch circuits 22 as illustrated. In addition, the measurement circuitry 74a may include, or couple to, current sensors coupled to the branch circuits 22 to sense the filter circuit branch currents $I_a$, $I_b$ and $I_c$ flowing in the associated capacitor circuit branches 22a, 22b and 22c, respectively.

One embodiment of the degradation detection system 70 is depicted in FIGS. 1 and 2, including a microprocessor element 71 along with an electronic memory 73, comparator circuitry 72, a voltage computation component 74 and one or more thresholds 76. The degradation detection system 70 can be any suitable hardware, processor-executed software, processor-executed firmware, programmable logic, analog circuitry, etc. or combinations thereof which provides the described capacitor degradation detection functionality, which may include multiplication, summation, filtering, squaring, and square root functional computations and/or threshold comparison functionality in certain embodiments as set forth hereinafter, and the system 70 may be operative using one or more processor elements 71 executing computer executable instructions stored in an electronic memory 73 of the system 70.

The degradation detection system 70 may include one or more components, some of which may be implemented as software and/or firmware components in execution, programmable logic, etc., including digital current computation component 74b with analog-to-digital conversion 82, multiplication functions 84, 86 and 91, summation functions 85 and 90 (including subtraction), square root functions 88, an optional delay function 89, a moving average function 94, an absolute value function 96, comparators 72, and the memory 73 in certain embodiments may store one or more threshold values 76.

The degradation detection system 70 in certain implementations provides one or more output signals or values 78 to identify a detected filter capacitor degradation condition in the filter circuit 20, which may include an indication that at least one capacitor $C_{ab}$, $C_{bc}$ and/or $C_{ca}$ of the filter circuit 20 is over capacitance or under capacitance or otherwise out of tolerance. In one implementation, as illustrated in FIG. 1, the degradation detection or identification signal 78 may be provided to the motor drive controller 60 to initiate one or more actions, such as shutting down the motor drive 10 and/or providing an alert or warning signal or other indication, for instance, to a user interface associated with the motor drive 10 and/or to a connected network (not shown).

As best seen in FIG. 2, the illustrated example includes measurement circuitry 74a as well as digital processing circuitry or processor-implemented logic 74b for DC equivalent voltage computation, including a comparator function 72 to compare voltage change values 97 with one or more thresholds 76 for selective provision of one or more filter capacitor degradation condition signals or values 78, providing a non-limiting embodiment of the voltage computation component 74 in FIG. 1. In the non-limiting embodiment of FIG. 2, the system 70 includes analog measurement circuitry 74a with differential amplifiers 80 measuring filter circuit line-to-line voltages $v_{ab}$, $v_{bc}$ and $v_{ca}$, as well as analog low pass filter (LPF) circuits 81 operative to low pass filter the measured filter circuit voltages $v_{ab}$, $v_{bc}$ and $v_{ca}$. In addition, current sensor inputs $i_a$, $i_b$ and $i_c$ are provided to corresponding low pass filter circuits 81 for filtering measured filter circuit branch currents sensed along the capacitor circuit branches 22a, 22b and 22c, respectively. In one possible implementation, the low pass filter circuits 81 have a cutoff frequency above the operating frequency of the system 10. For example, a cutoff frequency of approximately 200 Hz can be used for a motor drive system 10 operating from a 50 Hz or 60 Hz supply in one non-limiting embodiment. Moreover, the low pass filters 81 may be implemented as analog filter circuits in one embodiment, or low pass filtering may be implemented following the analog-to-digital converters 82, for example, using infinite impulse response (IIR) filters 81 having a low pass filter cutoff frequency of around 200 Hz in one non-limiting embodiment.

Analog-to-digital converters 82 are provided in the example of FIG. 2 for concurrent sampling and conversion of the measured filter circuit voltages $v_{ab}$, $v_{bc}$ and $v_{ca}$ and filter branch currents $i_a$, $i_b$ and $i_c$, with the converters 82 providing converted digital values $v_{ab}$, $v_{bc}$ and $v_{ca}$ representing the line-to-line voltages provided to the delta-connected capacitor bank, as well as converted digital values $i_a$, $i_b$ and $i_c$ representing the measured filter circuit branch currents. In this regard, the use of separate ADC stages 82 operating concurrently in the example of FIG. 2 for each of the measured values advantageously ensures that the resulting comparisons correspond with one another, and thus presents a significant advantage in detecting capacitor degradation compared to multiplexing the inputs to a single shared analog-to-digital converter.

The digital processing component 74b further computes DC equivalent current and voltage values using six multipliers 84 configured to compute squared current values $i_a^2$, $i_b^2$ and $i_c^2$ and squared line-line voltage values $v_{ab}^2$, $v_{bc}^2$ and $v_{ca}^2$ as shown in FIG. 2. The squared current values $i_a^2$, $i_b^2$ and $i_c^2$ are summed via a summation component 85, and the summation result is divided by three (e.g., multiplied using multiplier component 86 by ⅓ through multiplication of a value 87 stored in the memory 73 in one example). The resulting divided sum of squares value is provided from the multiplier component 86 to a square root function component 88 to provide the square root of the sum of squares value. In this manner, the digital processing component 74b provides a present expected DC equivalent current value based on the measured AC branch currents $i_a$, $i_b$ and $i_c$.

A present expected DC equivalent voltage value 75 (Vex) is then computed via multiplication component 91 as the product of the present expected DC equivalent current value from the square root function 88 and a filter capacitor impedance value Z. In the illustrated example, for instance, the capacitor impedance value Z is computed by an impedance computation component 92 based at least partially on a nominal capacitance value 93 (Cnom) and a system operating frequency "f". The frequency value "f" in one example is generated by a phase locked loop (PLL) component 83 in the measurement circuit 74a based on one of the measured voltages or currents (e.g., $v_{ca}$ in this non-limiting implementation). Any suitable technique can be used for measuring or computing a system operating frequency "f", including without limitation zero crossing detection techniques, phase locked loops, etc. In other possible embodiments, the frequency "f" can be a predetermined value, for example, where the operating frequency of a given motor drive 10 is known in advance, with the frequency value being stored in the electronic memory 73 for use by the processor component 71 in determining the impedance value Z. In other possible implementations, the filter capacitor impedance value Z may be predetermined, and stored in the electronic memory 73 for use by the multiplier component 91 to determine the present expected DC equivalent voltage value Vex 75.

In certain embodiments, moreover, the nominal capacitance value 93 is determined based on production specifications for the individual filter capacitor elements or groups thereof, in consideration of any series and/or parallel connection of multiple capacitors to form the individual filter capacitors $C_{ab}$, $C_{bc}$ and $C_{ca}$. Moreover, the nominal value 73 may be predetermined according to an expected value or range of operating frequency, such as about 50 Hz or 60 Hz in certain non-limiting examples, wherein the impedance calculated at the fundamental operating frequency "f" provides the greatest magnitude (e.g., $Z=1/\omega C$). In the illustrated embodiment, the multiplication via the component 91 produces the present expected DC equivalent voltage value 75 as the product of the impedance value Z multiplied by the square root of the sum of squares value provided from the square root component 88. The digital processing component 74b may compute an expected DC equivalent voltage value 75 using other formulaic approaches in other embodiments, based at least partially on two or more filter circuit branch currents and a filter capacitor impedance value, wherein the above-described square root of the sum of squares approach is but one non-limiting example.

In the illustrated delta-connected filter circuit example, moreover, the digital processing component 74b includes an optional delay component 89 to provide a delayed expected DC equivalent voltage value to a summation component 90 for comparison with a measured DC equivalent voltage value Vm 77. In certain embodiments, for example, the delay component 89 provides a delay of approximately 30 electrical degrees of a fundamental frequency AC cycle or period, although any suitable delay may be used, and the delay component 89 may be omitted in certain implementations, such as the Y-connected filter example illustrated and described below in connection with FIG. 6.

The digital processing component 74b also computes a present measured DC equivalent voltage value 77 at least partially according to the plurality of filter voltages, in this case, the line-line voltages $v_{ab}$, $v_{bc}$ and $v_{ca}$. As seen in FIG. 2, differential amplifiers 80 are configured in the measurement circuit 74a to measure the line-line voltages $v_{ab}$, $v_{bc}$ and $v_{ca}$, and these are provided to low pass filters circuit components 81 in the illustrated example. The filtered circuit voltage values are then converted to digital form via analog-to-digital (ADC) converters 82, and multipliers 84 are used to compute the squares of the line-line voltages (e.g., $v_{ab}^2$, $v_{bc}^2$ and $v_{ca}^2$), which are then summed using a summation component 85 and multiplied by the constant 87 using multiplier 86 (e.g., divided by three), and the square root component 88 computes the square root of the result from the summation component 85 in order to produce a present measured DC equivalent voltage value 77 (Vm).

This measured DC equivalent voltage value 77 is provided to the summation component 90 for subtraction from the delayed expected DC equivalent voltage value 75 to produce a voltage change value 79 ($\Delta V$). Using a comparator 72, the system selectively identifies a filter capacitor degradation condition in the filter circuit 20 at least partially according to the voltage change value 79. In various implementations, the voltage change value 79 represents a voltage deviation of a stored measured DC equivalent voltage value 77 and a stored expected DC equivalent voltage value 75. Any suitable voltage change value computation approach may be used. In one possible embodiment, the measured DC equivalent voltage value 77 is subtracted from the delayed expected DC equivalent voltage value 75 to compute the voltage change value 79 using the summation component 90. In certain implementations, this value 79 is compared with one or more thresholds 76 via comparator component 72, and if the difference value 79 exceeds or equals a threshold 76, a filter capacitor degradation condition is indicated or identified via an output signal or value 78. As illustrated in FIG. 2, moreover, in other implementations a moving average component 94 computes a moving average voltage change value 95 according to a present voltage change value 79 for the current sample cycle, as well as a plurality of previous voltage change values 79 from previous cycles, and an absolute value (ABS) component 96 computes an absolute value 97 of the moving average voltage change value, which is then compared with the threshold value or values 76 via the comparators 72.

Figure 4:
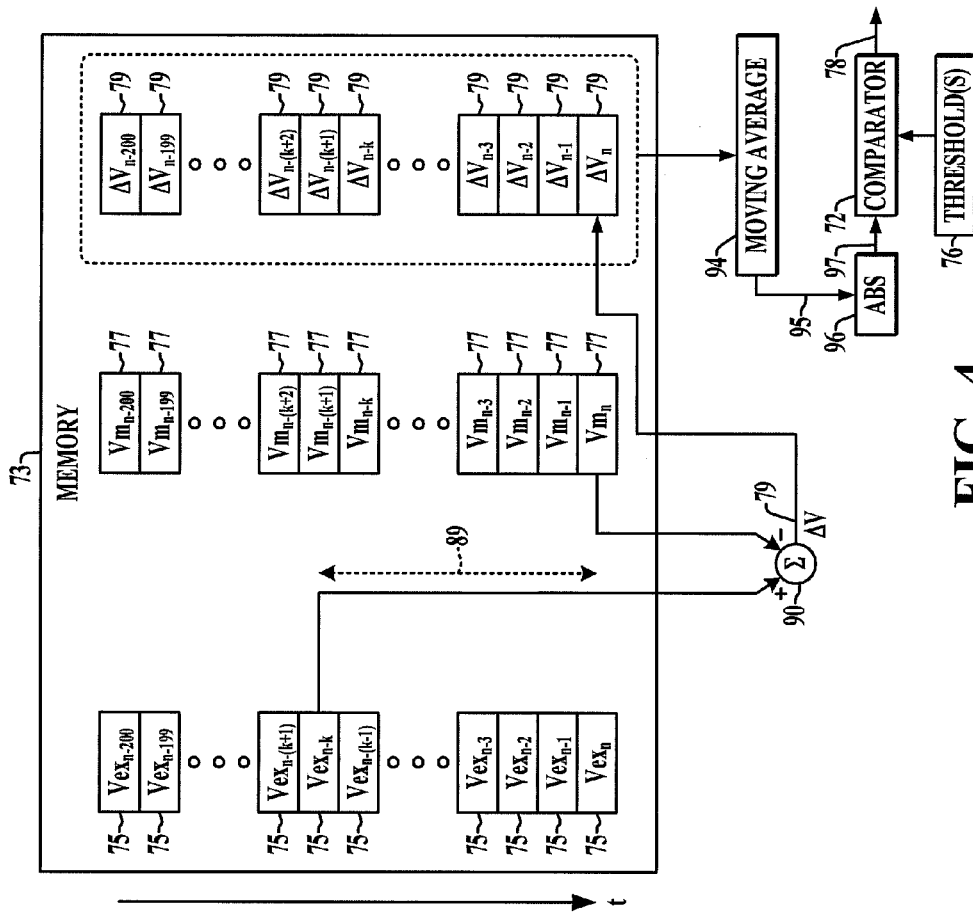
FIG. 4 is a partial schematic diagram illustrating computation of a voltage change value by subtracting a present measured DC equivalent voltage value from a delayed expected DC equivalent voltage value in one embodiment.

Referring also to FIG. 4, the system 70 in certain implementations computes and stores the value 75, 77 in the electronic memory 73 in each of a series of update or sample cycles, and implements any optional delay functionality 89 through selective usage of temporally offset values 75 and 77. FIG. 4 illustrates exemplary expected and measured DC equivalent voltage values 75, 77 stored in the electronic memory 73 for each of an integer number (e.g., 200) sample cycles, where the current or present cycle is denoted by the subscript "n", the immediately preceding sample cycle is denoted "n−1", etc. In this implementation, the degradation detection system 70 obtains samples of the filter circuit branch currents and voltages in each sample cycle, and computes a present expected DC equivalent voltage value 75 and a present measured DC equivalent voltage value 77 in each sample cycle. In each cycle, moreover, the system 70 computes the voltage change value 79 ($\Delta V$) and stores this in the memory 73 as shown.

For the illustrated delta-connected filter circuit 20 of FIGS. 1 and 2, moreover, the system 70 implements the delay function 89 by providing the present measured DC equivalent voltage value 77 ($Vm_n$) to the summation component 90 for subtraction from a delayed expected DC equivalent voltage value 75 ($Vex_{n-k}$) which is delayed by an integer number "k" sample cycles to determine the voltage change value 79, which is then stored in the electronic memory 73 for the present cycle ($\Delta V_n$). In certain embodiments, the processor 71 is programmed to dynamically determine the integer "k" based on the operating frequency "f" and the sample rate of the ADC converters 82 to implement a target delay time in terms of electrical degrees. In this example, moreover, a proceeding plurality of computed voltage change value 79 are then provided to the moving average component 94, which computes a moving average value 95 for input to the ABS component 96, with the absolute value of the moving average 97 being provided to the comparator component 72 for comparison with one or more thresholds 76.

Figure 5:
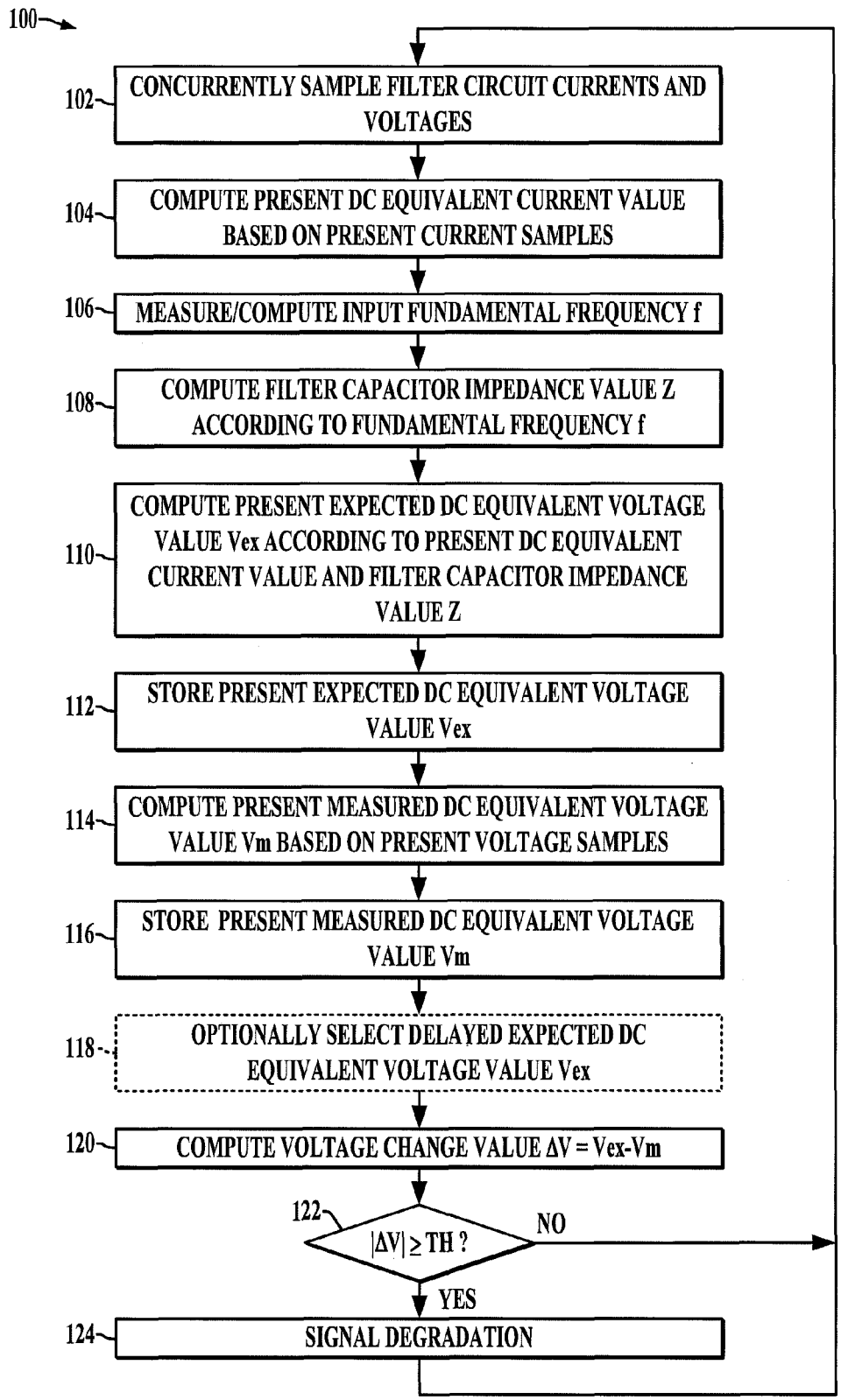
FIG. 5 is a flow diagram illustrating an exemplary method for selectively identifying filter capacitor degradation according to an embodiment.

FIG. 5 illustrates an exemplary method 100 for detecting capacitor degradation in a filter circuit in accordance with various embodiments. While the method 100 is illustrated and described as a series of acts or events, the methods of the present disclosure are not limited by the illustrated ordering of such acts or events except as specifically set forth herein. Except as specifically provided hereinafter, some acts or events may occur in different order and/or concurrently with other acts or events apart from those illustrated and described herein, and not all illustrated steps may be required to implement a process or method in accordance with the present disclosure. The illustrated methods may be implemented in hardware, processor-executed software or processor-executed firmware, or combinations thereof, and various embodiments or implementations include non-transitory computer readable mediums having computer-executable instructions for performing the illustrated and described methods. For example, the method 100 may be implemented by using analog circuitry 74a and a programmed processor 71 as described herein using program instructions for filter capacitor degradation detection or identification, with various instructions and data being stored in the non-transitory electronic memory 73 associated with the processor 71, although the method 100 can be implemented in other systems, including without limitation those illustrated and described herein.

The method 100 begins at 102 with the concurrent sampling of filter currents and voltages (e.g., $i_a$, $i_b$, $i_c$, $v_{ab}$, $v_{bc}$ and $v_{ca}$ using the measurement circuit 74a in the configuration of FIGS. 1 and 2 above). At 104 in FIG. 5, a present DC equivalent current value is computed at least partially according to the filter circuit branch currents $i_a$, $i_b$ and $i_c$. In the example of FIG. 5, moreover, a fundamental input frequency "f" is measured or computed at 106, and a filter capacitor impedance value Z is computed at 108 according to the fundamental frequency f. In other embodiments, the frequency f can be a predefined value stored in the electronic memory 73, or the filter capacitor impedance value Z may be a predetermined value stored in the memory 73. At 110, a present expected DC equivalent voltage value 75 (Vex) is computed according to the present DC equivalent current value and the filter capacitor impedance value Z, and is stored in the electronic memory 73 at 112. At 114, a present measured DC equivalent voltage value Vm 77 is computed at least partially according to the filter circuit voltages (e.g., $v_{ab}$, $v_{bc}$ and $v_{ca}$), for example, using the square root of the sum of squares approach illustrated and described above, and this value is stored in the electronic memory 73 at 116.

At 118 in FIG. 5, a delayed expected DC equivalent voltage value 75 may be selected from the electronic memory 73, for example, using the technique set forth in FIG. 4 above or other suitable phase shifting technique, and a voltage change value 79 is computed at 120. For example, the measured DC equivalent voltage value 77 for the current sample period may be subtracted from a delayed expected DC equivalent voltage value 75 (e.g., from a previous sample cycle) at 120 to compute the voltage change value 79. A determination is made at 122 in FIG. 5 as to whether an absolute value of the voltage change value is greater than or equal to a threshold value TH. If so (YES at 122), the system 70 signals filter capacitor degradation at 124, and the process returns to 102 for the next sample cycle. Otherwise (NO at 122), no degradation is identified, and the process returns to 102 for the next sampling cycle.

Figure 6:
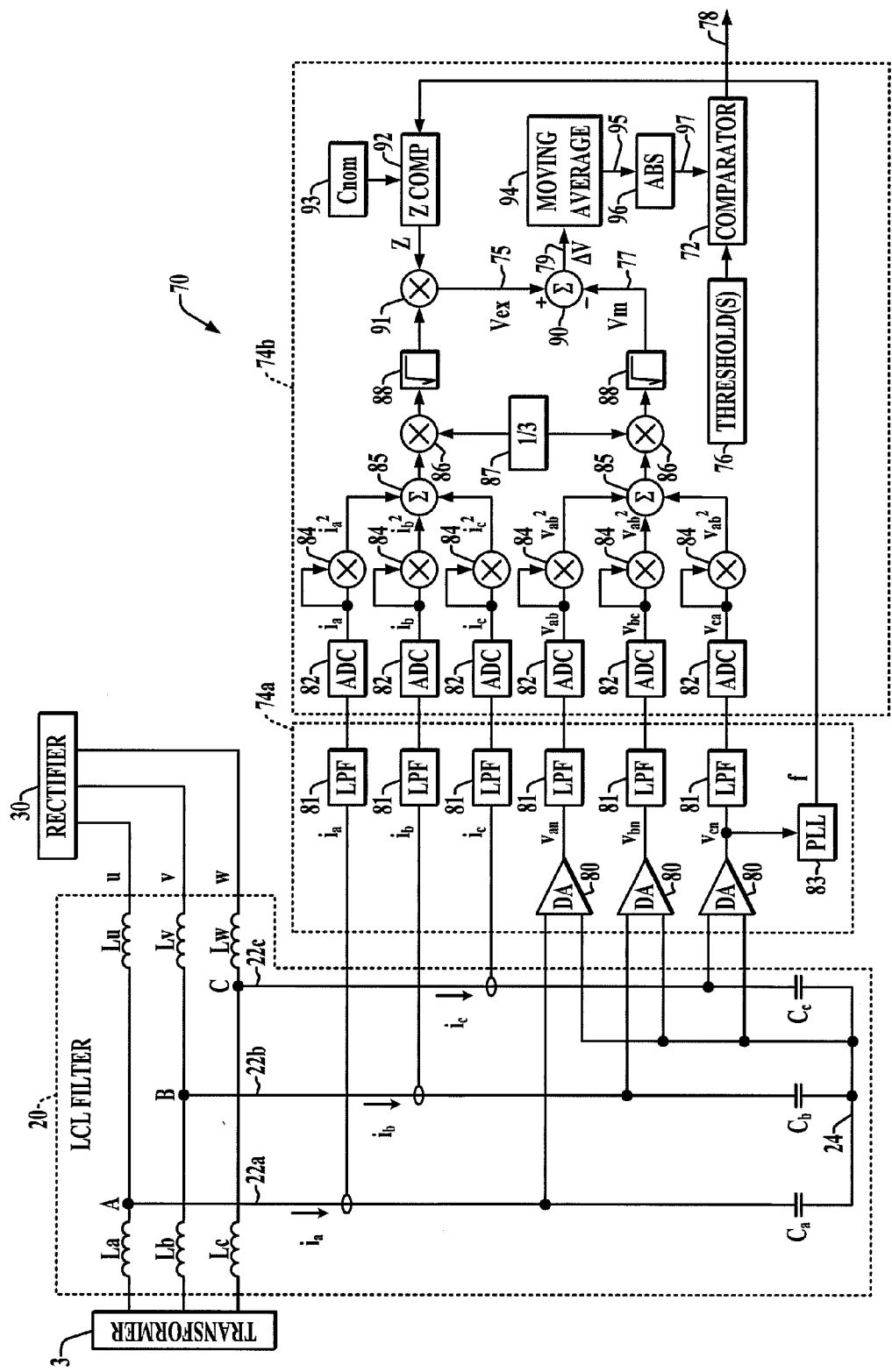
FIG. 6 is a schematic diagram illustrating another exemplary AFE motor drive with an input LCL filter having Y-connected filter capacitors, and a degradation detection system according to one embodiment.

Referring also to FIG. 6, another motor drive power converter embodiment 10 is shown, including an LCL filter circuit 20, a rectifier 30, intermediate DC link circuit 40 and inverter 50 operated by a motor drive controller 60 generally as described above to power a motor or other AC load 6 using power from an AC input source 2. The LCL filter 20 in FIG. 6 includes series circuits individually including two series-connected inductors (La and Lu, etc.) with corresponding capacitor circuit branches 22 connecting the series circuits with three filter capacitors $C_a$, $C_b$ and $C_c$ connected in a "Y" configuration with each filter capacitor C connected between a corresponding one of the capacitor circuit branches 22 and a common connection node 24 (e.g., a neutral node). Other embodiments are possible in which the filter circuit 20 is an L-C configuration with only a single inductor in each of the series circuits, such as where the motor drive 10 is used in combination with an input transformer 3, in which case the inductors La, Lb and Lc can be omitted. The exemplary circuit 74a is constructed in generally the same manner as that shown in FIG. 2 above, with the differential amplifiers 80 measuring line-neutral voltages $V_{an}$, $V_{bn}$ and $V_{cn}$ instead of line-to-line voltages as was the case in the delta-connected configuration of FIGS. 1 and 2. These voltages and the measured branch currents $i_a$, $i_b$ and $i_c$ are low pass filtered via filter circuits 81 and converted to digital form via the analog-to-digital converters 82.

In certain embodiments, the converters 82 operate concurrently to sample and convert the corresponding currents and voltages, with the converted voltages representing line-to-neutral voltages $v_{an}$, $v_{bn}$ and $v_{cn}$ as shown in FIG. 6. These voltages are squared via the multipliers 84 and the squared results are summed via the summation components 85 as in the above example of FIG. 2. Unlike the case in FIG. 2, however, the computed expected DC equivalent voltage value 75 is not delayed in the Y-connected case of FIG. 6, and is instead provided directly to the summation component 90 for subtraction of the measured DC equivalent voltage value 77 to derive the voltage change value 79.

The filter capacitor degradation detection system 70 in this case operates as described above in connection with FIGS. 1 and 2 with the system 70 measuring filter circuit branch currents and voltages associated with the filter 20, computing expected DC equivalent voltage values using the measured currents and the impedance value Z, computing measured DC equivalent voltage values, and computing the DC equivalent voltage change values 79 representing deviations of the measured DC equivalent voltage value 77 and the expected DC equivalent voltage value 75 in each of a plurality of sample cycles, where the computed values and the resulting voltage change value 79 may be stored in the electronic memory 73 in certain embodiments. The system 70 selectively identifies one or more filter capacitor degradation conditions in the filter circuit 20 at least partially according to the voltage change values as discussed above, for example, through threshold comparison. In addition, the system may employ different threshold values 76 for delta and Y-connected filter circuit capacitor bank in the circuit 20, where the DC equivalent voltage change value thresholds 76 may be set according to a predetermined amount (e.g. 20% in one example) of tolerable variation in the capacitance value of the filter circuit capacitors $C_a$, $C_b$ and $C_c$.

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising". This description uses examples to disclose various embodiments and also to enable any person skilled in the art to practice the disclosed subject matter, including making and using any devices or systems and performing any incorporated methods. It will be evident that various modifications and changes may be made, and additional embodiments may be implemented, without departing from the broader scope of the present disclosure as set forth in the following claims, wherein the specification and drawings are to be regarded in an illustrative rather than restrictive sense.

The following is claimed:

1. A method for detecting capacitor degradation in a filter circuit, the method comprising:
    measuring a plurality of filter circuit branch currents and a plurality of filter circuit voltages associated with the filter circuit;
    computing a present expected DC equivalent voltage value at least partially according to the plurality of filter circuit branch currents and a filter capacitor impedance value;
    storing the present expected DC equivalent voltage value in an electronic memory;
    computing a present measured DC equivalent voltage value at least partially according to the plurality of filter circuit voltages;
    storing the present measured DC equivalent voltage value in the electronic memory;
    computing a voltage change value representing a voltage deviation of a stored measured DC equivalent voltage value and a stored expected DC equivalent voltage value in the electronic memory; and
    selectively identifying a filter capacitor degradation condition in the filter circuit at least partially according to the voltage change value.

2. The method of claim 1, comprising computing the filter capacitor impedance value at least partially according to a fundamental input frequency of a voltage or current in the filter circuit.

3. The method of claim 2, comprising:
    measuring the fundamental input frequency; and
    computing the filter capacitor impedance value according to the measured fundamental input frequency and a nominal filter capacitance value.

4. The method of claim 1, wherein computing the present expected DC equivalent voltage value comprises:
    computing a sum of current squares value of the plurality of filter circuit branch currents;
    dividing the sum of current squares value by an integer corresponding to the number of filter branch currents in the filter circuit;
    computing a square root of the divided sum of current squares value; and
    multiplying the square root by the filter capacitor impedance value.

5. The method of claim 4, wherein computing the present measured DC equivalent voltage value comprises:
    computing a sum of voltage squares value of the plurality of filter circuit voltages; and
    dividing the sum of voltage squares value by an integer corresponding to the number of filter branch currents in the filter circuit.

6. The method of claim 1, wherein computing the voltage change value comprises computing a voltage deviation of the present measured DC equivalent voltage value and a delayed expected DC equivalent voltage value computed using previously measured filter circuit branch currents.

7. The method of claim 6, wherein computing the present measured DC equivalent voltage value comprises:
    computing a sum of voltage squares value of the plurality of filter circuit voltages; and
    dividing the sum of voltage squares value by an integer corresponding to the number of filter branch currents in the filter circuit.

8. The method of claim 6, comprising computing the filter capacitor impedance value at least partially according to a fundamental input frequency of a voltage or current in the filter circuit.

9. The method of claim 8, wherein selectively identifying a filter capacitor degradation condition in the filter circuit comprises:
    computing a moving average voltage change value according to a present voltage change value and a plurality of previous voltage change values;
    computing an absolute value of the moving average voltage change value;
    comparing the absolute value to a threshold value; and
    identifying a filter capacitor degradation condition in the filter circuit if the absolute value is greater than or equal to the threshold value.

10. The method of claim 1, wherein computing the present measured DC equivalent voltage value comprises:
    computing a sum of voltage squares value of the plurality of filter circuit voltages; and
    dividing the sum of voltage squares value by an integer corresponding to the number of filter branch currents in the filter circuit.

11. The method of claim 1, wherein selectively identifying a filter capacitor degradation condition in the filter circuit comprises:
    computing a moving average voltage change value according to a present voltage change value and a plurality of previous voltage change values;
    computing an absolute value of the moving average voltage change value;
    comparing the absolute value to a threshold value; and
    identifying a filter capacitor degradation condition in the filter circuit if the absolute value is greater than or equal to the threshold value.

12. The method of claim 11, wherein computing the voltage change value comprises subtracting the stored measured DC equivalent voltage value from the stored expected DC equivalent voltage value.

13. The method of claim 1, wherein computing the voltage change value comprises subtracting the stored measured DC equivalent voltage value from the stored expected DC equivalent voltage value.

14. The method of claim 13, wherein computing the voltage change value comprises subtracting the present measured DC equivalent voltage value from a delayed expected DC equivalent voltage value computed using previously measured filter circuit branch currents.

15. A non-transitory computer readable medium with computer executable instructions for:
measuring a plurality of filter circuit branch currents and a plurality of filter circuit voltages associated with the filter circuit;
computing a present expected DC equivalent voltage value at least partially according to the plurality of filter circuit branch currents and a filter capacitor impedance value;
storing the present expected DC equivalent voltage value in an electronic memory;
computing a present measured DC equivalent voltage value at least partially according to the plurality of filter circuit voltages;
storing the present measured DC equivalent voltage value in the electronic memory;
computing a voltage change value representing a voltage deviation of a stored measured DC equivalent voltage value and a stored expected DC equivalent voltage value in the electronic memory;
selectively identifying a filter capacitor degradation condition in the filter circuit at least partially according to the voltage change value.

16. A power conversion system, comprising:
a power converter input operative to receive multiphase AC input power;
an active front end (AFE) rectifier;
a filter circuit coupled between the power converter input and the AFE rectifier, the filter circuit comprising first, second, and third series circuits individually including at least one filter inductor coupled between a corresponding phase of the power converter input and a corresponding phase of the three phase AC input of the AFE rectifier, first, second, and third capacitor circuit branches respectively connected to the first, second and third series circuits, and three filter capacitors with each filter capacitor being connected to at least one of the capacitor circuit branches;
a measurement circuit operatively coupled with the input filter circuit to measure a plurality of filter circuit branch currents associated with the filter circuit and a plurality of filter circuit voltages associated with the filter circuit; and
at least one processor programmed to:
compute a present expected DC equivalent voltage value at least partially according to the plurality of filter circuit branch currents and a filter capacitor impedance value;
compute a present measured DC equivalent voltage value at least partially according to the plurality of filter circuit voltages;
compute a voltage change value representing a voltage deviation of a stored measured DC equivalent voltage value and a stored expected DC equivalent voltage value in the electronic memory; and
selectively identify a filter capacitor degradation condition in the filter circuit at least partially according to the voltage change value.

17. The power conversion system of claim 16, comprising a plurality of analog to digital converter circuits configured to concurrently sample and convert the plurality of filter circuit branch currents and the plurality of filter circuit voltages in each of a plurality of sample cycles.

18. The power conversion system of claim 16, wherein the at least one processor is programmed to:
compute a moving average voltage change value according to a present voltage change value and a plurality of previous voltage change values;
compute an absolute value of the moving average voltage change value;
compare the absolute value to a threshold value; and
identify a filter capacitor degradation condition in the filter circuit if the absolute value is greater than or equal to the threshold value.

19. The power conversion system of claim 18, wherein the at least one processor is programmed to compute the voltage change value as a voltage deviation of the present measured DC equivalent voltage value and a delayed expected DC equivalent voltage value computed using previously measured filter circuit branch currents.

20. The power conversion system of claim 16, wherein the at least one processor is programmed to compute the voltage change value by subtracting the stored measured DC equivalent voltage value from the stored expected DC equivalent voltage value.

21. The power conversion system of claim 16, wherein the at least one processor is programmed to compute the voltage change value by subtracting the present measured DC equivalent voltage value from a delayed expected DC equivalent voltage value computed using previously measured filter circuit branch currents.

* * * * *